(12) United States Patent
Sharma et al.

(10) Patent No.: US 9,565,789 B2
(45) Date of Patent: Feb. 7, 2017

(54) DETERMINING REGIONS OF INFLUENCE OF FLUID MOVING DEVICES

(75) Inventors: Ratnesh Kumar Sharma, Fremont, CA (US); Manish Marwah, Mountain View, CA (US); Cullen E. Bash, Los Gatos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 2231 days.

(21) Appl. No.: 12/609,706

(22) Filed: Oct. 30, 2009

(65) Prior Publication Data

US 2011/0106751 A1    May 5, 2011

(51) Int. Cl.
H05K 7/20    (2006.01)

(52) U.S. Cl.
CPC ................ *H05K 7/20836* (2013.01)

(58) Field of Classification Search
CPC .... G05B 13/027; G05B 15/02; F24F 11/0015; H05K 7/20745
See application file for complete search history.

(56) References Cited

U.S. PATENT DOCUMENTS

| | | | |
|---|---|---|---|
| 6,574,104 B2 | 6/2003 | Patel et al. | |
| 6,697,707 B2 | 2/2004 | Peters, II | |
| 6,859,882 B2 | 2/2005 | Fung | |
| 7,117,129 B1 * | 10/2006 | Bash et al. | 702/194 |
| 7,596,431 B1 | 9/2009 | Forman et al. | |
| 2003/0193777 A1 | 10/2003 | Friedrich | |
| 2005/0228618 A1 | 10/2005 | Patel et al. | |
| 2006/0052968 A1 * | 3/2006 | Miller et al. | 702/127 |
| 2006/0075764 A1 | 4/2006 | Bash | |
| 2008/0004837 A1 | 1/2008 | Zwinger et al. | |

OTHER PUBLICATIONS

Mukherjee et al., Systematic Temperature Sensor Allocation and Placement for Microprocessors, 2006.*

* cited by examiner

*Primary Examiner* — Gregory J Toatley
*Assistant Examiner* — Kyle R Quigley
(74) *Attorney, Agent, or Firm* — Mannava & Kang, P.C.

(57) ABSTRACT

A method for determining regions of influence of a plurality of fluid moving devices in an infrastructure is provided. In the method, a plurality of clusters are generated, with each of the plurality of clusters containing a representation of fluid supply data pertaining to a fluid moving device and one or more of the plurality of sensors based upon collected sensor and fluid supply data. In addition, regions of influence of each of the plurality of fluid moving devices are identified from an analysis of the generated clusters.

14 Claims, 5 Drawing Sheets

DETERMINING REGIONS OF INFLUENCE OF FLUID MOVING DEVICES

CROSS REFERENCE TO RELATED APPLICATIONS

The present application contains similar subject matter and refers to U.S. Pat. No. 7,117,129, issued on Oct. 3, 2006 to Cullen E. Bash et al., and entitled "Commissioning of Sensors", and to U.S. Pat. No. 7,596,431, issued on Sep. 29, 2009 to George Forman et al., and entitled "Method for Assessing Electronic Devices", the disclosures of which are hereby incorporated by reference in their entireties.

BACKGROUND

Multiple cooling resources, such as, air conditioning units, are typically deployed and shared among multiple locations that require cooling to dissipate heat generated in infrastructures, such as, data centers. Temperature sensors are also typically positioned throughout the infrastructures, which operate to identify the cooling requirements at the various locations in the infrastructures. Oftentimes, the cooling resources are operated to provide cooling based upon the demand at the various locations in the infrastructures as identified by the temperature sensors. In order to operate the cooling resources efficiently, the "region of influence" of each cooling resource is typically determined. The "region of influence" information identifies which cooling resource to manipulate if the temperature at a particular location changes.

The region of influence of each cooling resource differs depending on the locations of the temperature sensors, the configurations of the cooling resources, and the configurations of the paths of the cooling medium supplied by the cooling resources. The process of discovering the regions of influence of the cooling resources is often called "commissioning" and typically requires varying the actuation level of each cooling resource in turn and measuring its impact at each of the sensor locations. This commissioning process allows a corresponding sensitivity metric, which indicates the change in temperature value at a particular location as a result of a unit change in the actuation of the cooling resource, to be computed. Although the commissioning process yields accurate determinations of the regions of influence, the commissioning process is typically time-consuming and laborious.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and an analyzer for automatically determining regions of influence of a plurality of fluid moving devices in an infrastructure. Also disclosed herein is a computer readable storage medium on which is embedded one or more computer programs storing the disclosed method. As further disclosed herein, the regions of influence are determined through implementation of a cluster analysis on both physical and correlation metrics-based relationships between the fluid moving devices and a plurality of sensors.

Through implementation of the method, analyzer and computer readable storage medium disclosed herein, the amount of time required to identify the regions of influence of a plurality of fluid moving devices may substantially be reduced as compared with conventional commissioning operations. The amount of time required to identify the regions of influence may substantially be reduced because, as disclosed herein, the regions of influence are identified without requiring the air moving devices be manipulated. In one regard, therefore, the regions of influence may be identified with a minimal amount of disruption to the infrastructure operations.

Figure 1:
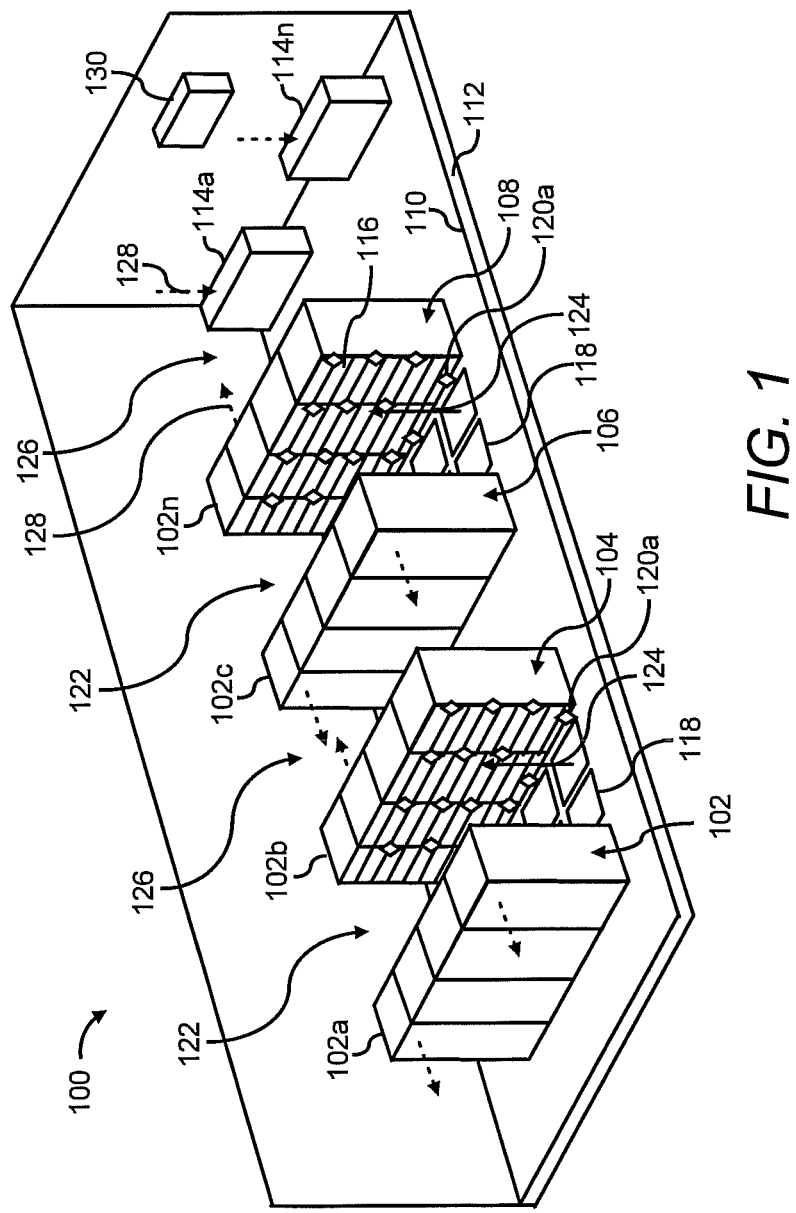
FIG. 1 shows a simplified perspective view of a section of an infrastructure 100, in this instance, a data center, in which a method and analyzer for determining regions of influence of a plurality of fluid moving devices may be implemented, according to an embodiment of the invention.

With reference first to FIG. 1, there is shown a simplified perspective view of a section of an infrastructure 100, in this instance, a data center, in which a method and analyzer for determining regions of influence of a plurality of fluid moving devices may be implemented, according to an example. It should be understood that the infrastructure 100 may include additional elements and that some of the elements described herein may be removed and/or modified without departing from a scope of the infrastructure 100.

The infrastructure 100 is depicted as having a plurality of racks 102*a*-102*n*, a plurality of fluid moving devices 114*a*-114*n*, and a plurality of sensors 120*a*-120*n*. As discussed in greater detail herein below, environmental condition information collected by the sensors 120*a*-120*n* are used to determine regions of influence in the infrastructure 100 for each of the fluid moving devices 114*a*-114*n*. More particularly, through implementation of the method and analyzer disclosed herein below, the regions of influence of each of the fluid moving devices 114*a*-114*n* are determined without requiring that a relatively lengthy commissioning process be implemented.

The racks 102*a*-102*n* are positioned on a raised floor 110 and house electronic devices 116 capable of generating/dissipating heat, for instance, computers, servers, bladed servers, disk drives, displays, etc. As shown in FIG. 1, when the fluid comprises a gas, such as air or a gaseous refrigerant, the fluid is delivered through fluid delivery devices 118 in the floor 110 to the racks 102a-102n. In other instances in which the fluid comprises a liquid, such as water, a liquid refrigerant, a multi-state refrigerant, etc., the fluid may be delivered to the racks 102a-102n through a series of pipes (not shown). The fluid moving devices 114a-114n generally operate to supply fluid flow to a space 112 beneath the raised floor 110, and in certain instances to cool heated fluid (indicated by the arrows 128). The fluid moving devices 114a-114n may comprise widely available, conventional air conditioning (AC) units.

In any regard, the cooled fluid contained in the space 112 may include cooled fluid supplied by one or more fluid moving devices 114a-114n, and in certain instances, fluid flow recirculated into the space 112. Thus, characteristics of the cooled fluid, such as, temperature, pressure, humidity, flow rate, etc., delivered to various locations in the infrastructure 100 may substantially be affected by the operations of a plurality of the fluid moving devices 114a-114n. As such, conditions at various locations in the infrastructure 100 may substantially be affected by the operations of more than one of the fluid moving devices 114a-114n.

The sensors 120a-120n may be networked with an analyzer 130 and may be configured to convey detected condition information through any suitable wired or wireless means. As described below, the analyzer 130 may employ the condition information received from the sensors 120a-120n to determine the level of influence each of the fluid moving devices 114a-114n has over areas near each of the sensors 120a-120n. The detected conditions may include, for instance, temperature, pressure, fluid flow volume, humidity, etc. Although the analyzer 130 is illustrated in FIG. 1 as comprising an element separate from the electronic components 116, the analyzer 130 may comprise or be integrated with one or more of the electronic components 116 without departing from a scope of the data center 100 disclosed herein. In addition, or alternatively, the analyzer 130 may comprise software configured to operate on a computing device, for instance, one of the electronic components 116 or a separate computing device.

Figure 2:
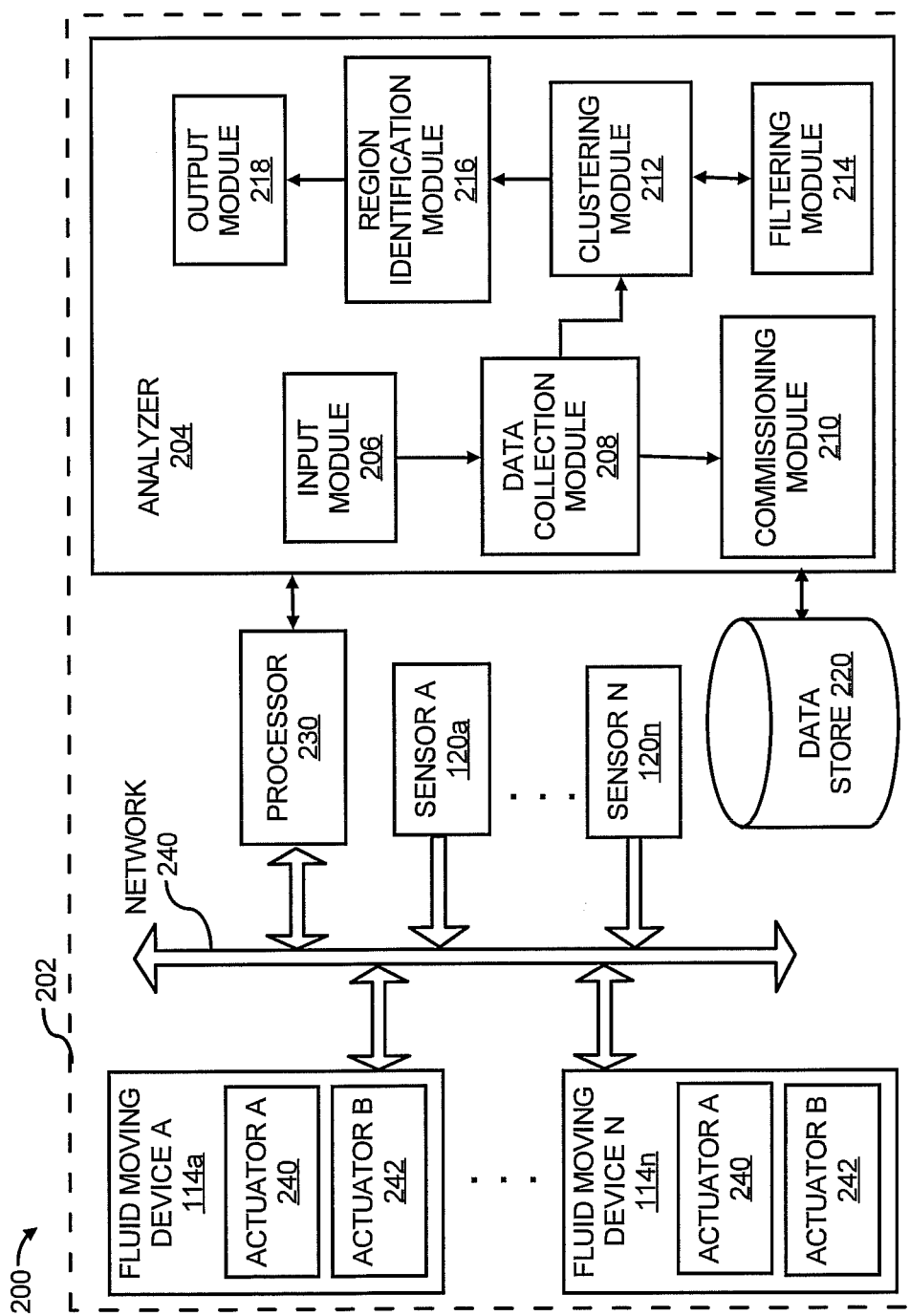
FIG. 2 shows a block diagram of a system for determining regions of influence of a plurality of fluid moving devices in an infrastructure, such as the infrastructure depicted in FIG. 1, according to an embodiment of the invention.

Turning now to FIG. 2, there is shown a block diagram 200 of a system 202 for determining regions of influence of a plurality of fluid moving devices in an infrastructure, such as the infrastructure 100 depicted in FIG. 1, according to an example. It should be understood that the following description of the block diagram 200 is but one manner of a variety of different manners in which such a system 202 may be configured. In addition, it should be understood that the system 202 may include additional components and that some of the components described herein may be removed and/or modified without departing from the scope of the system 202. For instance, the system 202 may include any number of sensors, memories, processors, fluid moving devices, etc., as well as other components, which may be implemented in the operations of the system 202.

As shown, the system 202 includes an analyzer 204, which may be equivalent to the analyzer 130 depicted in FIG. 1. The analyzer 204 is depicted as including an input module 206, a data collection module 208, a commissioning module 210, a clustering module 212, a filtering module 214, a region identification module 216, and an output module 218. Various manners in which the modules 206-218 operate are discussed in detail herein below with respect to the method 300 depicted in FIG. 3.

According to an example, the analyzer 204 comprises software stored, for instance, in a volatile or non-volatile memory, such as DRAM, EEPROM, MRAM, flash memory, floppy disk, a CD-ROM, a DVD-ROM, or other optical or magnetic media, and the like. In this example, the modules 206-216 comprise software modules stored in the memory, which are executable by a processor 230 of a computing device. According to another example, the analyzer 204 comprises a hardware device, such as, a circuit or multiple circuits arranged on a board. In this example, the modules 206-218 comprise circuit components or individual circuits, which may also be controlled by a processor of a computing device. According to a further example, the analyzer 204 comprises a combination of hardware and software modules.

Generally speaking, the analyzer 204 is configured to automatically determine regions of influence of a plurality of fluid moving devices, for instance, the fluid moving devices 114a-114n of the infrastructure 100 depicted in FIG. 1. According to a particular example, the determined regions of influence may be employed in identifying how one or more of the fluid moving devices 114a-114n may be manipulated to achieve desired environmental conditions in various locations within the infrastructure.

The analyzer 204 is configured to evaluate condition information received from the sensors 120a-120n in determining the regions of influence of the plurality of fluid moving devices 114a-114n. In this regard, the analyzer 204 may receive the condition information from the sensors 120a-120n over a network 240 that operates to couple the various components of the system 202. Although not shown, the processor 230 may be equipped with or have access to software and/or hardware to enable the processor 230 to transmit and receive data over the network 240. The network 240 generally represents a wired or wireless structure in the infrastructure for the transmission of data between the various components of the system 202.

In any regard, the analyzer 204 is configured to store the condition information received from the sensors 120a-120n in a data store 220, which may comprise any reasonably suitable memory upon which the analyzer 204 may store data and from which the analyzer 204 may retrieve data. Although the data store 220 has been depicted as forming a separate component from the analyzer 204, it should be understood that the data store 220 may be integrated with the analyzer 204 without departing from a scope of the system 200.

The analyzer 204 may also output the determined regions of influence through the output module 118. Thus, for instance, the determined regions of influence may be outputted a display upon which the outputted information may be displayed, a printer upon which the outputted information may be printed, a connection over which the outputted information may be conveyed to another computing device, a data storage device upon which the outputted information may be stored, etc.

According to a particular example where the processor 230 is configured to control operations of the fluid moving devices 114a-114n, the processor 230 may receive the determined regions of influence and may transmit instructions over the network 230 to the fluid moving devices 114a-114n to vary operations of one or more of the fluid moving devices 114a-114n. As shown, the fluid moving devices 114a-114n each includes an actuator A 240 and an actuator B 242. The actuators 240 and 242 generally comprise devices for controlling different aspects of the fluid flow supplied by the fluid moving devices 114a-114n, which are also actuators.

By way of example, the actuators 240 may comprise fluid flow volume varying devices, such as, variable frequency drives (VFDs), fans, blowers, etc. In addition, the actuators 242 may comprise fluid flow temperature varying devices, such as, water-chillers, compressors, valves, etc. The processor 230 may control the actuators 240 and 242 of the fluid moving devices 114a-114n to vary one or more characteristics of the fluid flow detected by the sensors 120a-120n.

Figure 3:
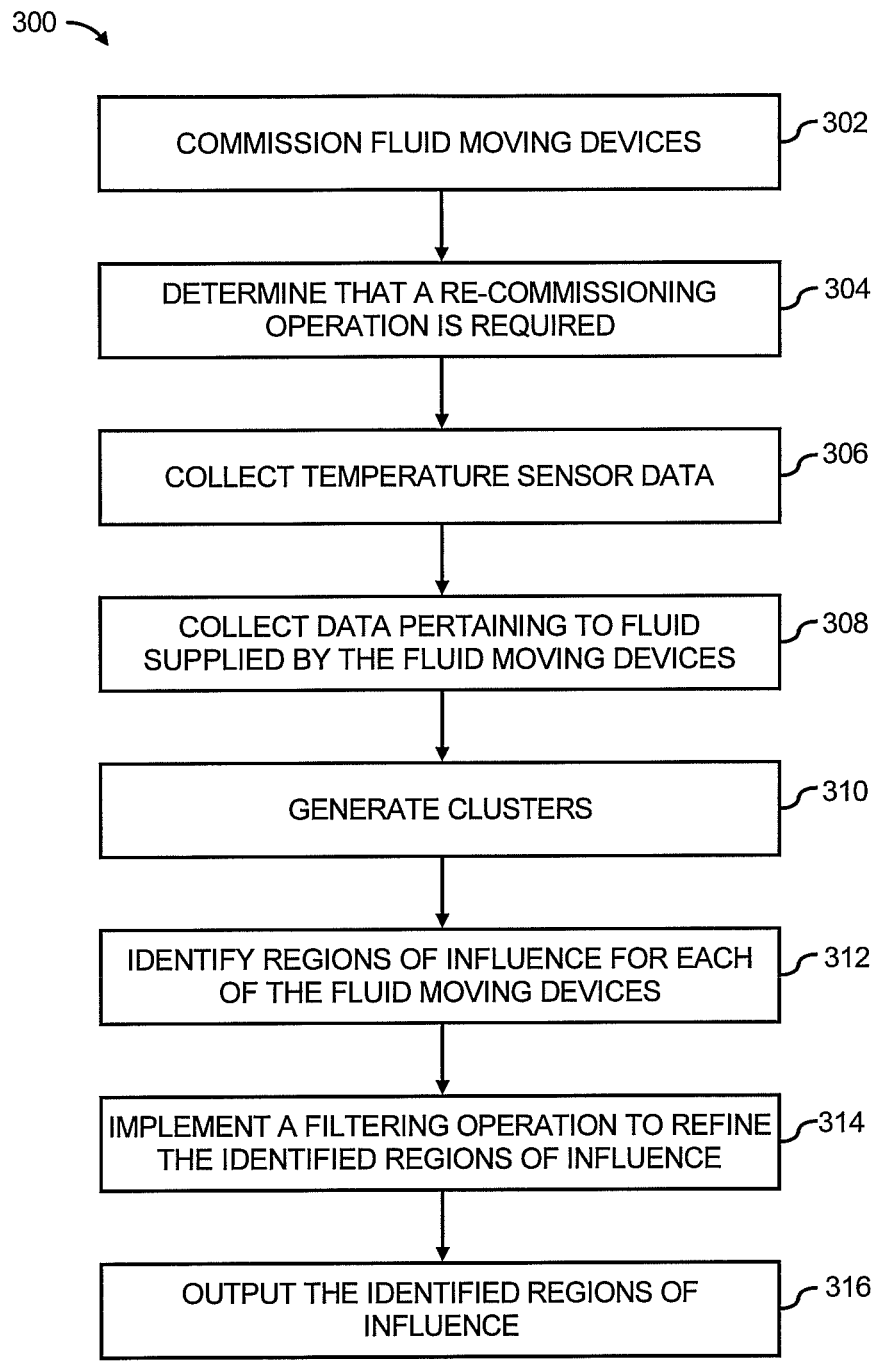
FIG. 3 depicts a flow diagram of a method of automatically determining regions of influence of a plurality of fluid moving devices in an infrastructure in an expedient manner, according to an embodiment of the invention.
Figure 4:
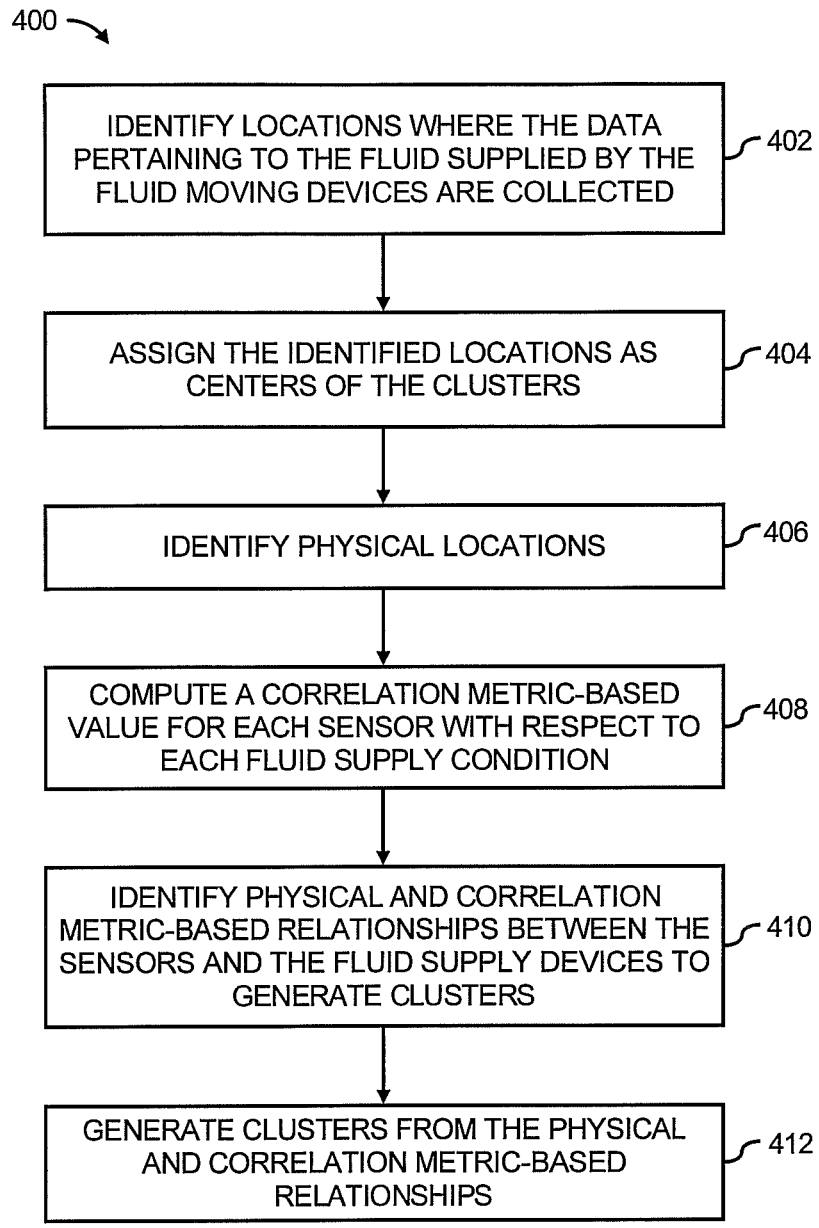
FIG. 4 depicts a flow diagram of a method for generating the clusters discussed in the flow diagram depicted in FIG. 3, according to an embodiment of the invention.

Various manners in which the modules 204-218 of the analyzer 204 may operate are discussed with respect to the methods 300 and 400 depicted in FIGS. 3 and 4. FIG. 3, more particularly depicts a flow diagram of a method 300 of automatically determining regions of influence of a plurality of fluid moving devices in an infrastructure in an expedient manner, according to an example. FIG. 4, more particularly depicts a flow diagram of a method 400 for generating the clusters discussed in the method 300, according to an example. It should be apparent to those of ordinary skill in the art that the methods discussed below with respect to FIGS. 3 and 4 represent generalized illustrations and that other steps may be added or existing steps may be removed, modified or rearranged without departing from the scopes of the methods 300 and 400.

Although particular reference is made to the analyzer 204 depicted in FIG. 2 as performing the steps outlined in the methods 300 and 400, it should be understood that the methods 300 and 400 may be performed by a differently configured analyzer without departing from the scopes of the methods 300 and 400.

At step 302, a commissioning operation is performed on the fluid moving devices 114a-114n to discover initial regions of influence of the fluid moving devices 114a-114n, for instance, by the commissioning module 210. The commissioning process may comprise the commissioning process disclosed in U.S. Pat. No. 7,117,129, which has been referenced above. As discussed in that patent, correlation data between sensors and a plurality of actuators are determined based upon conditions detected by the sensors at a plurality of actuator settings.

In addition, the commissioning operation performed at step 302 may be implemented to also identify thermal correlation coefficients (TCIs) between the fluid moving devices 114a-114n and the sensors 120a-120n, which are described in detail in U.S. Pat. No. 7,596,431, which has also been referenced above. As discussed in that patent, TCI is a measure of the relative level of influence a fluid moving device has over a particular area in a room, as identified by the measurements obtained by the sensors placed at various locations in the room. Thus, for instance, the higher the TCI value at a particular location for a fluid moving device, the greater the influence the fluid moving device has over that location. The following discussion is an excerpt from U.S. Pat. No. 7,596,431.

Although the TCI of a fluid moving device may be calculated through any number of suitable correlation algorithms, the following algorithm may be employed to calculate the TCI of a fluid moving device and a number of sensor locations (i) in a room.

$$TCI_i = \frac{(T_1 - T_2)}{N}. \quad \text{Equation (1)}$$

In Equation (1), $T_1$ is a temperature measurement determined at a first fluid moving device setting and $T_2$ is a temperature measurement determined at a second fluid moving device setting. In addition, N is the amount of supply fluid condition change for the fluid moving device between the first temperature measurement and the second temperature measurement.

At step 304, a determination that a re-commissioning process is required is made, for instance, by the processor 230 or an operator. For example, the processor 230 or the operator may track the temperatures collected by the sensors 120a-120n and may determine that the temperatures at one or more locations are not changing as expected in response to changes in the fluid delivery conditions to those one or more locations, which may occur when the configuration of components in the infrastructure changes. As another particular example, the processor 230 may employ the TCI values of the sensors 120a-120n with respect to individual fluid moving devices 114a-114n to predict how the conditions at the sensors 120a-120n should be affected by changes in the fluid supply and may determine that a re-commissioning operation is required when an error from the predicted response exceeds a predefined threshold.

At step 306, data pertaining to conditions, such as temperature, fluid flow velocity, fluid volume flow rate, etc., sensed by the sensors 120a-120n are collected, for instance, by the data collection module 208. In addition, the locations of the sensors 120a-120n may be identified at step 306 from, for instance, a database containing information on the locations of the sensors 120a-120n, the network addresses of the sensors 120a-120n, etc.

At step 308, data pertaining to fluid supplied by each of the fluid moving devices 114a-114n is also collected, for instance, by the data collection module 208. The data pertaining to the fluid supplied by each of the fluid moving devices 114a-114n may relate to, for instance, the temperatures, the volume flow rates, etc., of the fluid supplied by each of the fluid moving devices 114a-114n. These conditions may be detected by sensors integrated with or separate from the fluid moving devices 114a-114n.

The data sensed by the sensors 120a-120n and pertaining to the fluid supplied by the fluid moving devices 114a-114n may be continuously collected and stored, for instance, in the data store 220. For example, the data may be collected for a predetermined length of time, for instance, a day, a couple of days, etc. According to a particular example, the data is collected from a point when a relationship change between actuation of one or more of the fluid moving devices 114a-114n and sensed data is expected to have occurred.

At step 310, a plurality of clusters, each containing a fluid moving device 114a-114n and one or more of the plurality of sensors 120a-120n, is generated, for instance, by the clustering module 212. The clusters may be defined as associating the sensors 120a-120n with the fluid moving devices 114a-114n based upon the locations of the sensors 120a-120n with respect to the fluid moving devices 114a-114n and the average temperatures detected by the sensors 120a-120n over a period of time and the average temperatures of the fluid supplied by the fluid moving devices 114a-114n over the same period of time. According to an example, the clustering module 212 is configured to implement a conventional clustering algorithm, such as, hierarchical clustering, K-means clustering, K-medoid clustering, fuzzy c-means clustering, spectral clustering, etc., to generate the clusters, in which, the locations where the fluid supply conditions are detected are the centers of the clusters. In addition, the clustering module 212 is configured to identify clusters around each of the locations where the fluid supply conditions are detected in terms of both locations of the sensors 120a-120n and the conditions sensed by the sensors 120a-120n. A more detailed discussion of how the clusters are generated at step 310 is provided below with respect to the method 400 depicted in FIG. 4.

With particular reference to FIG. 4, which may be implemented by the clustering module 212, and at step 402, the locations in the infrastructure where the data pertaining to the fluid supplied by each of the plurality of fluid moving devices are collected are identified. These locations may be identified manually by an operator or automatically from the network addresses from which the data is collected. In addition, the identified locations may be defined in three dimensional space with x, y, and z-axis coordinates.

At step 404, the identified locations of where the fluid supply conditions are collected are used to seed the clusters, and more particularly, are assigned as the centers of the clusters. Thus, a cluster may be generated for each of the locations where the fluid supply conditions are collected.

At step 406, the physical locations of the sensors 120a-120n are identified. The physical locations of the sensors 120a-120n may be defined in three dimensional space using x, y, and z-axis coordinates. The physical locations of the sensors 120a-120n may also be determined manually by an operator or automatically based upon network address information.

At step 408, a correlation metric-based value is computed for each sensor 120a-120n with respect to each fluid supply condition. Generally speaking, the correlation metric-based values are values that signify how related the conditions detected by the sensors 120a-120n are to the fluid supply conditions of the fluid supply devices 114a-114n. In other words, the correlation metric-based values provide information on the dependence of the conditions detected by the sensors 120a-120n to the fluid supply conditions of the fluid supply devices 114a-114n over a time series. Thus, for instance, the correlation metric-based values may signify how related the temperatures at the sensors 120a-120n are to the temperatures of the fluid supplied by the fluid supply devices 114a-114n over a particular time series.

Conventional correlation metrics may be employed to compute the correlation metric-based values. Examples of suitable correlation metrics include, Pearson's correlation coefficient, Spearman's and Kendall's rank correlation coefficient, correlation ratio, mutual information from information theory, etc. By way of particular example, Pearson's correlation coefficient and Spearman's rank correlation coefficient ranks correlations between two quantities between 0 and 1, in which 0 indicates a complete lack of dependence and 1 indicates complete dependence.

At step 410, physical and correlation metric-based relationships are identified between the sensors 120a-120n and the locations where the data pertaining to the fluid supplied by each of the fluid moving devices are collected. Thus, for instance, the physical distances in three dimensions between each of the sensors 120a-120n and each of the locations where data pertaining to the fluid supplied by each of the fluid moving devices are collected may be identified, for instance, to determine which of the sensors 120a-120n are in the closest proximity to which of the locations where the supply fluid conditions are collected.

In addition to the physical distances, the correlation metric-based values of each of the sensors 120a-120n with respect to each of the locations where the supply fluid conditions are collected are identified. Thus, for instance, a sensor 120a having a closer dependence to a particular fluid supply device 114a may be identified as being closer to that particular fluid supply device 114a than to a fluid supply device 114b to which the sensor 120a has a lesser dependence.

At step 410, therefore, the distances between different data points are defined in four dimensions, three dimensions for the locations and one dimension for the correlation metric-based relationships. The distances between the different data points may be determined as Euclidean distances, absolute distances, sum of the absolute distances in each of the dimensions, etc.

According to an embodiment, the values for each of the dimensions that define the physical locations and the correlation metric-based values are normalized with respect to the values in those particular dimensions. Thus, for instance, the distances and correlation metric-based values may be normalized between values of 0 and 1 such that both of these values may be considered together. In addition, the distance measures may be weighed differently from the correlation metric-based values in considering how to cluster the sensors 120a-120n with respect to the fluid moving devices 114a-114n.

At step 412, the clusters are generated from the identified physical and correlation metric-based relationships.

With reference back to FIG. 3, at step 312, the distances between the sensors 120a-120n and respective locations where the supply fluid conditions are collected are analyzed to identify the regions of influence of each of the fluid moving devices 114a-114n, for instance, by the region identification module 216. The regions of influence may be identified based upon the results of the clustering generation performed at step 310. More particularly, the region identification module 216 may analyze the cluster arrangements to determine which of the sensors 120a-120n are assignable to which of the fluid moving devices 114a-114n based upon the cluster arrangements and may determine the regions of influence from the assignments. By way of particular example, the sensors 120a-120n may be assigned to the respective fluid moving devices 114a-114n to which they are most closely clustered.

In addition, at step 314, a filtering operation may be implemented to refine the regions of influence identified at step 312, for instance, by the filtering module 214. More particularly, the correlation metric-based values for the sensors 120a-120n with respect to each of the fluid supply devices 114a-114n may be analyzed to determine whether the dependencies of one or more of the sensors 120a-120n with respect to the fluid supply devices 114a-114n are sufficiently low to warrant removal of the one or more sensors 120a-120n from the clusters of one or more of the fluid supply devices 114a-114n. In other words, for instance, the filtering module 214 may determine that the sensors 120a-120n that have correlation metric-based values that fall below a predefined threshold with respect to a particular fluid supply device's cluster are to be removed from that fluid supply device's cluster.

The predefined threshold may be based upon a user's experiences or based upon the correlation metric-based values of other relationships. By way of particular example, the sensors 120a-120n having correlation metric-based values that fall within the lowest 10% or 20% of the correlation metric-based values may be considered as failing to be sufficiently dependent on a particular fluid supply device and may thus be filtered out from the clusters. Thus, the filtering operation performed at step 314 may cause the regions of influence identified at step 312 to be modified.

At step 316, the identified regions of influence of each of the fluid supply devices 114a-114n are outputted, for instance, through the output module 218. As discussed above, the identified regions of influence may be outputted to a display, printer, or other computing device for analysis by an operator. In addition, or alternatively, the output module 218 may output the identified regions of influence to a controller of the fluid moving devices 114a-114n, which may implement this information in determining how to modify the fluid supply device 114a-114n operations as conditions change in the infrastructure.

Some or all of the operations set forth in the methods 300 and 400 may be contained as utilities, programs, or subprograms, in any desired computer accessible medium. In addition, the methods 300 and 400 may be embodied by computer programs, which can exist in a variety of forms both active and inactive. For example, they may exist as software program(s) comprised of program instructions in source code, object code, executable code or other formats. Any of the above may be embodied on a computer readable storage medium.

Exemplary computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 5:
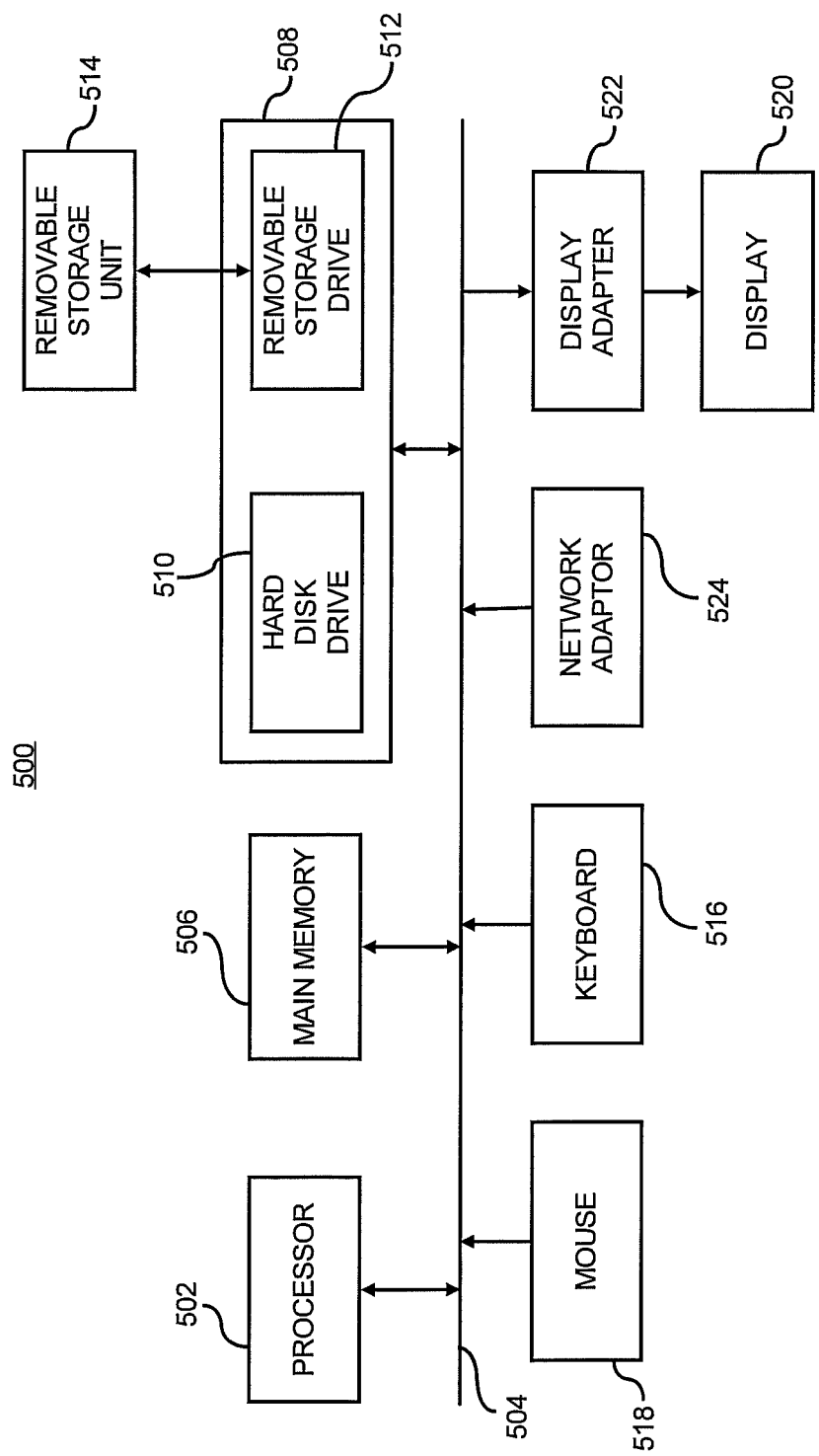
FIG. 5 illustrates a computer system, which may be employed to perform various functions described herein, according to an embodiment of the invention.

FIG. 5 illustrates a block diagram of a computing apparatus 500 configured to implement or execute the methods 300 and 400 depicted in FIGS. 3 and 4, according to an example. In this respect, the computing apparatus 500 may be used as a platform for executing one or more of the functions described hereinabove with respect to the analyzer 204.

The computing apparatus 500 includes a processor 502 that may implement or execute some or all of the steps described in the methods 300 and 400. Commands and data from the processor 502 are communicated over a communication bus 504. The computing apparatus 500 also includes a main memory 506, such as a random access memory (RAM), where the program code for the processor 502, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the methods 300 and 400 may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor(s) 502 may communicate over a network, for instance, the Internet, LAN, etc., through a network adaptor 524.

It will be apparent to one of ordinary skill in the art that other known electronic components may be added or substituted in the computing apparatus 500. It should also be apparent that one or more of the components depicted in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for determining regions of influence of a plurality of fluid moving devices in an infrastructure, said method comprising:
   collecting fluid supply data pertaining to an environmental condition of the fluid at respective outlets of each of the plurality of fluid moving devices;
   collecting sensor data from a plurality of sensors pertaining to an environmental condition of the fluid detected at positions distanced from the plurality of fluid moving devices;
   computing a correlation metric-based value for each of the plurality of sensors with respect to each of a plurality of fluid supply conditions over a predetermined time series during which the plurality of fluid moving devices are not put through a commissioning process in which each of the plurality of fluid moving devices are individually manipulated to identify correlations between the plurality of fluid moving devices and the plurality of sensors;
   generating, in a computing device, a plurality of clusters through implementation of a clustering operation on the correlation metric-based values, wherein each of the plurality of clusters contains a representation of the fluid supply data and the sensor data of one or more of the plurality of sensors; and
   identifying regions of influence of each of the plurality of fluid moving devices from an analysis of the generated clusters.

2. The method according to claim 1, wherein generating the plurality of clusters further comprises:
   identifying the locations in the infrastructure where the fluid supply data pertaining to the fluid supplied by each of the plurality of fluid moving devices is collected; and
   assigning each of the identified locations as a center of a respective cluster.

3. The method according to claim 2, further comprising:
   identifying physical locations of the plurality of sensors with respect to the infrastructure.

4. The method according to claim 3, further comprising:
   identifying physical and correlation metric-based relationships between the plurality of sensors and the plurality of fluid supply devices from the identified physical locations and the computed correlation metric-based values; and
   wherein generating the clusters further comprises generating the clusters from the identified physical and correlation metric-based relationships.

5. The method according to claim 4, wherein generating the plurality of clusters further comprises generating the plurality of clusters through implementation of a clustering operation on the identified physical and correlation metric-based relationships.

6. The method according to claim 4, wherein identifying the physical and correlation metric-based relationships further comprises normalizing the physical and correlation metric-based relationships to enable the physical and correlation metric-based relationships to be considered together.

7. An analyzer for determining regions of influence of a plurality of fluid moving devices in an infrastructure, said analyzer comprising:
   a processor;
   a memory on which is stored machine readable instructions that cause the processor to:
      compute a correlation metric-based value for each of a plurality of sensors with respect to each of a plurality of fluid supply conditions of the plurality of fluid moving devices over a predetermined time series during which the plurality of fluid moving devices are not put through a commissioning process in which each of the plurality of fluid moving devices are individually manipulated to identify correlations between the plurality of fluid moving devices and the plurality of sensors;
      generate a plurality of clusters through implementation of a clustering operation on the correlation metric-based values, wherein each of the plurality of clusters contains a representation of a fluid moving device and data collected from one or more of a plurality of sensors; and
      identify regions of influence of each of the plurality of fluid moving devices from an analysis of the generated clusters.

8. The analyzer according to claim 7, wherein the machine readable instructions are further to cause the processor to collect sensor data from the plurality of sensors at multiple locations in the infrastructure and to collect the fluid supply data pertaining to fluid supplied by each of the plurality of fluid moving devices.

9. The analyzer according to claim 7, wherein the machine readable instructions are further to cause the processor to identify locations in the infrastructure where the data pertaining to the fluid supplied by each of the plurality of fluid moving devices is collected, to assign each of the identified locations as a center of a respective cluster, and to identify physical locations of the plurality of sensors with respect to the infrastructure.

10. The analyzer according to claim 9, wherein the machine readable instructions are further to cause the processor to identify physical and correlation metric-based relationships between the plurality of sensors and the plurality of fluid supply devices from the identified physical locations and the computed correlation metric-based values and to generate the clusters through implementation of a clustering operation on the identified physical and correlation metric-based relationships.

11. A non-transitory computer readable storage medium on which is embedded one or more computer programs, said one or more computer programs implementing a method for determining regions of influence of a plurality of fluid moving devices in an infrastructure, said one or more computer programs, when executed by a processor cause the processor to:
   compute a correlation metric-based value for each of a plurality of sensors with respect to the fluid supplied by each of the plurality of fluid moving devices over a predetermined time series during which the plurality of fluid moving devices are not put through a commissioning process in which each of the plurality of fluid moving devices are individually manipulated to identify correlations between the plurality of fluid moving devices and the plurality of sensors;
   generate a plurality of clusters through implementation of a clustering operation on sensor data collected from the plurality of sensors, fluid supply data collected at respective outlets of each of the plurality of fluid moving devices, and the computed correlation metric-based values, each of the plurality of clusters containing a representation of a fluid moving device and one or more of the plurality of sensors; and
   identify regions of influence of each of the plurality of fluid moving devices from an analysis of the generated clusters.

12. The computer readable storage medium according to claim 11, wherein said one or more computer programs are further to cause the processor to:
   implement a filtering operation on the plurality of sensors with respect to the identified regions of influence to remove the plurality of sensors having correlation-metric based values that fall below a predefined threshold from the regions of influence.

13. The method according to claim 5, wherein the clustering operation comprises a clustering operation selected from the group consisting essentially of hierarchical clustering, K-means clustering, K-medoid clustering, fuzzy c-means clustering, and spectral clustering.

14. The analyzer according to claim 10, wherein the clustering operation comprises a clustering operation selected from the group consisting essentially of hierarchical clustering, K-means clustering, K-medoid clustering, fuzzy c-means clustering, and spectral clustering.

* * * * *